(12) United States Patent
Maszara et al.

(10) Patent No.: US 6,599,831 B1
(45) Date of Patent: Jul. 29, 2003

(54) METAL GATE ELECTRODE USING SILICIDATION AND METHOD OF FORMATION THEREOF

(75) Inventors: Witold Maszara, Morgan Hill, CA (US); Zoran Krivokapic, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/135,227

(22) Filed: Apr. 30, 2002

(51) Int. Cl.[7] ............................................. H01L 21/4763
(52) U.S. Cl. ..................... 438/649; 438/651; 438/655; 438/682
(58) Field of Search .................. 438/648, 649, 438/650, 651, 656, 655, 682, 683, 685

(56) References Cited

U.S. PATENT DOCUMENTS

| | | | | |
|---|---|---|---|---|
| 5,937,319 A | * | 8/1999 | Xiang et al. | 438/683 |
| 6,117,761 A | * | 9/2000 | Manning | 438/649 |
| 6,245,692 B1 | * | 6/2001 | Pearce et al. | 438/795 |
| 6,365,481 B1 | * | 4/2002 | Bonser et al. | 438/723 |
| 6,372,563 B1 | * | 4/2002 | Krivokapic et al. | 438/166 |
| 6,479,383 B1 | * | 11/2002 | Chooi et al. | 438/682 |

OTHER PUBLICATIONS

Totally Silicided (CoSi2) Polysilicon: a novel approach to a very low-resistive gate ( 2 ohms/square) without metal CMP nor etching. B. Tavel, T. Stotnicki, G. Pares, N. Carriere, M. Rivoire, F. Leverd, C. Julien, J. Torres, R. Pantel, Nov., 2001 (4 pages).

* cited by examiner

Primary Examiner—Kevin M. Picardat

(57) ABSTRACT

A semiconductor device is fabricated by providing a substrate, and providing a dielectric layer on the substrate. A polysilicon body is formed on the dielectric layer, and a metal layer is provided on the polysilicon body. A silicidation process is undertaken to silicidize substantially the entire polysilicon body to form a gate on the dielectric. In an alternative process, a cap layer is provided on the polysilicon body, which cap layer is removed prior to the silicidation process. The polysilicon body is doped with a chosen specie prior to the silicidation process, which dopant, during the silicidation process, is driven toward the dielectric layer to form a gate portion having a high concentration thereof adjacent the dielectric, the type and concentration of this specie being instrumental in determining the work function of the formed gate.

23 Claims, 5 Drawing Sheets

METAL GATE ELECTRODE USING SILICIDATION AND METHOD OF FORMATION THEREOF

BACKGROUND OF THE INVENTION

1. Technical Field

This invention relates generally to semiconductor technology, and more particularly, to semiconductor devices which incorporate a silicidation process.

2. Background Art

A common trend in modern integrated circuit manufacture is to produce transistors having feature sizes as small as possible. To achieve a high density integrated circuit, features such as the conductors, source and drain junctions, and interconnections to the junctions must be made as smallest possible. As feature sizes decrease, the sizes of the resulting transistors as well as the interconnections between transistors also decrease. Having smaller transistors allows more transistors to be placed on a single monolithic substrate. Accordingly, relatively large circuits can be incorporated on a single and relatively small die area. Furthermore, smaller transistors typically have lower turn on threshold voltages and faster switching speeds and consume less power in their operation. These features, in combination, allow for higher speed integrated circuits.

As semiconductor transistors are scaled to reduce their dimensions, a number of problems have been presented. For example, use of a very thin gate dielectric causes high gate current leakage, which diminishes device performance. Furthermore, as a transistor is scaled, a higher doping level is needed in the channel to reduce short channel effect, in order to ensure that the transistor properly turns off. This very high concentration of dopant in the channel decreases current drive and can lead to undesirable drain-to-channel tunneling current.

Furthermore, use of polysilicon gate technology, as is typical, carries with it additional problems. For example, polysilicon gates tend to suffer from polysilicon depletion or boron penetration effects, causing degradation in performance.

Additionally, a polysilicon gate has a fixed work function defined by a certain high level of doping of a particular specie or kind. For example, in a typical process, in an N type transistor wherein the gate, source and drain are doped with arsenic to a chosen (high) concentration, the resulting work function would be approximately 4.1 eV, while in a P type transistor, wherein the gate, source and drain are doped with boron to a chosen (high) concentration, the resulting work function would be approximately 5.0 eV. While such values are acceptable for typical devices, as such devices are scaled as described above, increasing the work function value to an extent in an N type device, and decreasing the work function value to an extent in a P type device, would allow a reduced level of doping concentration in the channel for the same threshold voltage, overcoming the problems associated with a high dopant level in the channel described above.

The use of metal in place of polysilicon as the gate of a transistor provides many advantages. For example, a typical such metal has a higher conductivity than polysilicon. Furthermore, there is the opportunity to choose a metal so that its particular work function is suited to the device, allowing reduction in the level of doping concentration in the channel. Additionally, the problems of polysilicon depletion and boron penetration are avoided, allowing one to use a thicker gate oxide with a metal gate, substantially reducing gate current leakage. However, proposed processes typically involve deposition of metal instead of polysilicon, requiring complex process integration schemes.

Therefore, a process and a device which overcome the above problems are needed.

DISCLOSURE OF THE INVENTION

In the present method, a semiconductor structure is fabricated by providing a substrate, and providing a dielectric on the substrate. A polysilicon body is provided on the dielectric, and a metal layer is provided on the polysilicon body. A silicidation process is undertaken to silicidize substantially the entire polysilicon body to form a gate on the dielectric. In an alternative process, a cap layer is provided on the polysilicon body, which cap layer is removed prior to the silicidation process. The polysilicon body is doped with a chosen specie prior to the silicidation process, which dopant is driven during the silicidation process toward the dielectric to form a gate portion having a high concentration thereof adjacent the dielectric, the type and conception of this specie being instrumental in determining the work function of the formed gate.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

BEST MODE(S) FOR CARRYING OUT THE INVENTION

Reference is now made in detail to specific embodiments of the present invention which illustrate the best mode presently contemplated by the inventors for practicing the invention.

Figure 1:
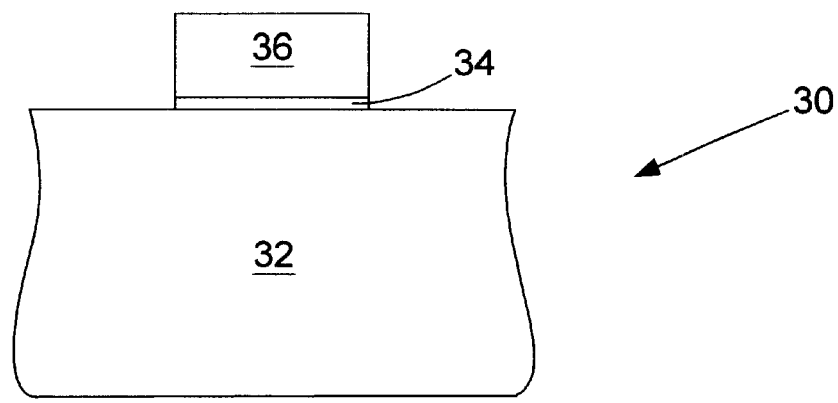
FIGS. 1–6 illustrate process steps in a first embodiment of the invention.
Figure 2:
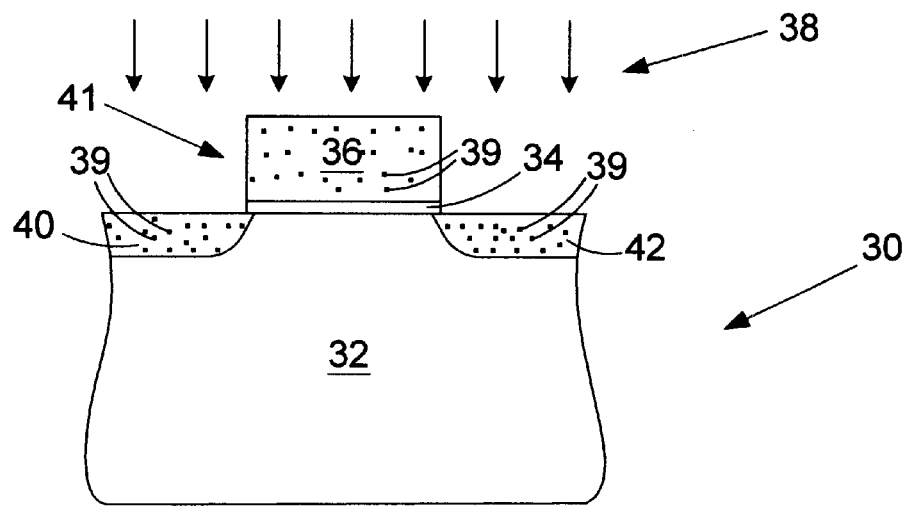
Figure 3:
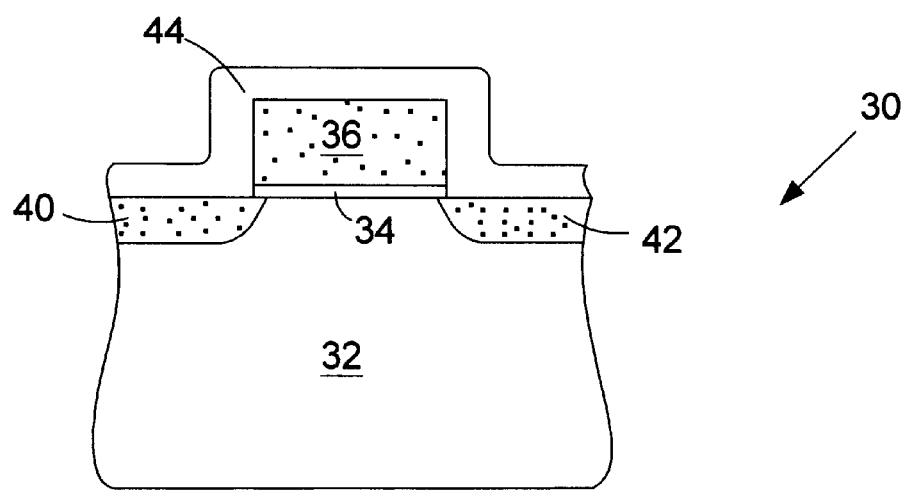

FIG. 1 illustrates a semiconductor device 30 including a silicon substrate 32 having formed thereon a dielectric in the form of a gate oxide 34, which in turn has thereon a polysilicon body 36, as is well known. An ion implantation 38 is undertaken (FIG. 2), using for example arsenic for an N type device, or boron for a P type device, so that ions 39 are implanted in the .silicon substrate 32 (using the polysilicon body 36 and the oxide 34 as an overall mask 41) to form lightly doped regions 40, 42 in the substrate 32, and in the polysilicon body 36. For an N type device, the dopant specie arsenic may be implanted at an energy level of for example 3 keV and a dosage level of for example 1 e15 cm$^2$, while for a P type device, the dopant specie boron may be implanted at an energy level of for example 4 keV and a dosage level of for example 2.5 e14 cm$^{-2}$. Thereafter, an oxide layer 44 is deposited over the resulting structure (FIG. 3), which oxide layer 44 is anisotropically etched to form spacers 46, 48 on the sides of the polysilicon body 36 (FIG. 4).

Figure 4:
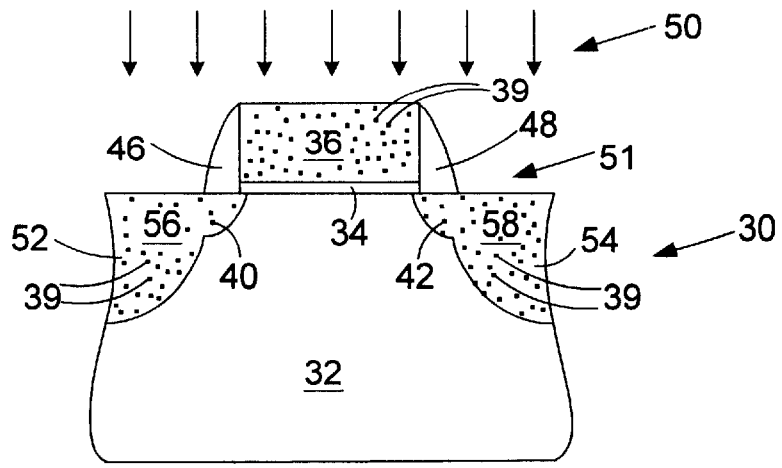

With further reference to FIG. 4, another ion implantation step 50 is undertaken, again for example using arsenic for an N type device, or boron for a P type device, so that ions 39 are implanted in the silicon substrate 32 to form heavily doped regions 52, 54 (using the polysilicon body 36, gate oxide 34, and spacers 46, 48 as an overall mask 51), and in the polysilicon body. For an N type device, arsenic may be implanted at an energy level of for example 30 keV and a dosage level of for example 4 e115 cm$^{-2}$, while for a P type device, boron may be implanted at an energy level of for example 3.5 keV and a dosage level of for example 2 e115 cm$^{-2}$.

Subsequent to formation of these implants, active annealing (such as rapid thermal anneal) is undertaken at a temperature of for example 1050° C. for 30 seconds to activate the implants to form the source and drain regions 56, 58 of the device 30.

Figure 5:
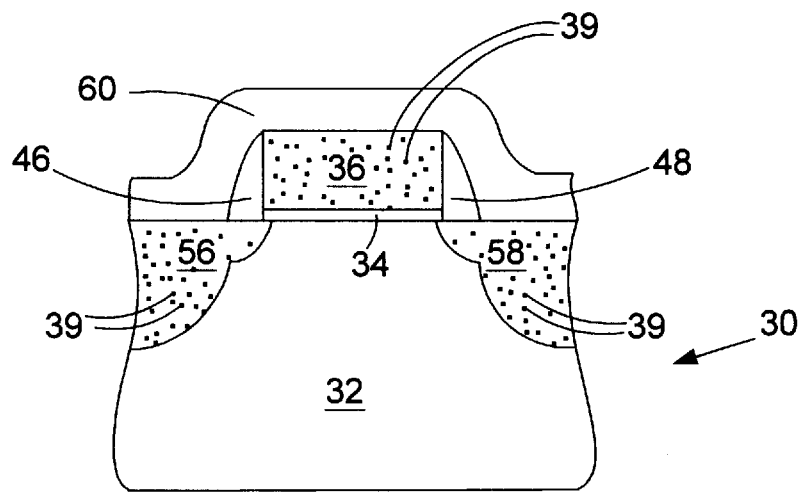
Figure 6:
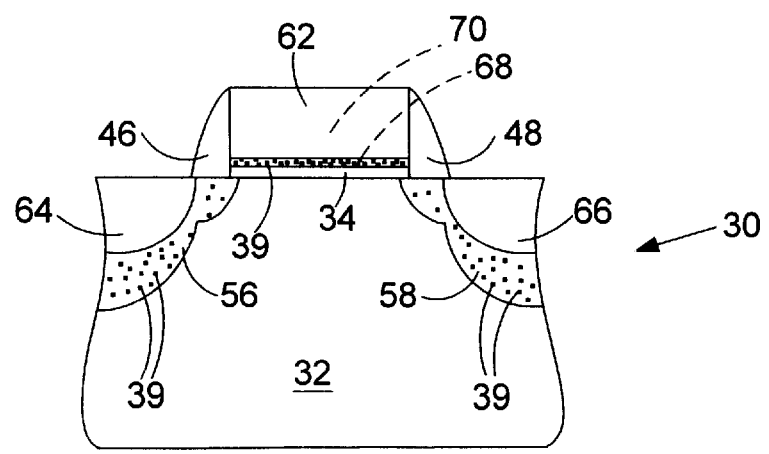

Next, with reference to FIG. 5, a metal layer 60, for example, nickel, is deposited over the resulting structure, i.e., over the polysilicon body 36, the spacers 46, 48, and the substrate 32 over the source and drain regions 56, 58. Then, the resulting structure undergoes a rapid thermal anneal at a temperature of for example 500° C., causing the nickel 60 to react with the silicon of the substrate 32 and the polysilicon body 36 to grow nickel silicide 62, 64, 66 into the polysilicon body 36 and into the source and drain regions 56, 58. The nickel layer 60 is thick enough in relation to the thickness of the polysilicon body 36, and the silicidation step is undertaken long enough, to provide that substantially the entire polysilicon body 36 is silicidized (since in this process the polysilicon 36 is consumed at approximately twice the rate of the nickel 60, the thickness of the nickel layer 60 is chosen to be more than one-half that of the thickness of the polysilicon body 36. For example, for a polysilicon body 36 thickness of 700 angstroms, a nickel layer 60 more than 350 angstroms in thickness is with advantage chosen). This process step forms nickel silicide gate 62 and nickel silicide regions 64, 66 in the source 56 and drain 58. The unreacted nickel portions are then removed, leaving the structure shown in FIG. 6.

It will be seen that through complete consumption of the polysilicon body 36 during the silicidation step, a metal gate 62 is formed Thus, the problems described above with regard to a polysilicon gate are overcome. That is, conductivity of the gate is improved as compared to a polysilicon gate, and the problems of polysilicon depletion and boron penetration are avoided.

During the silicidation process, the dopant specie 39 in the polysilicon body 36 (arsenic in the case of an N type device and boron in the case of a P type device in the above example), previously substantially evenly distributed within the polysilicon body 36, is driven downward by the downwardly advancing interface of nickel silicide and polysilicon until a substantial amount of the dopant specie 39 is in a portion 68 of the gate 62 adjacent the gate oxide 34, so that the portion 68 of the gate 62 adjacent the gate oxide 34 contains a substantially higher dopant concentration than the gate portion 70 further away from the gate oxide 34. The "snowplowing" of the dopant specie 39 as described above causes an unexpected resulting gate work function. For example, in the case of an N type device where the dopant specie 39 is arsenic, with process steps taken as described above, the resulting work function of the gate 62 has been found to be 4.35–4.4 eV, as compared to the work function 4.15 eV of a polysilicon gate. This increase in work function in an N type device allows a reduced level of dopant concentration in the device channel for the same device threshold voltage. With such a reduced level of dopant concentration in the channel, it can be ensured that proper transistor turn off will be provided, meanwhile avoiding the problems of decreased current drive and undesirable drain-to-channel tunneling current, all as described above.

Likewise, in the case of a P type device where the dopant specie 39 is boron, with process steps undertaken as described above, the resulting work function of the gate 62 has been found to be 4.9 eV, as compared to the work function 5.05 eV of a polysilicon gate. This decrease in work function in a P type device allows a reduced level of dopant concentration in the device channel for the same device threshold voltage, overcoming the problems described above.

By practicing this process, it will be understood that various work functions of the resulting gate can be selected as needed, depending on for example the dopant specie type, the dopant specie concentration (or indeed the lack of doping specie), the type of metal layer, and/or the silicidation process steps. By appropriate selection of these parameters, the work function of the resulting gate can be tailored to specific needs.

Figure 7:
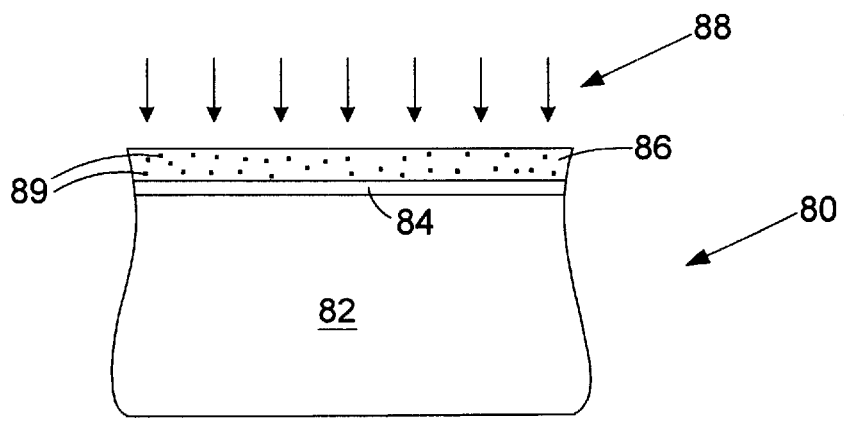
FIGS. 7–14 illustrate process steps in a second embodiment of the invention.
Figure 8:
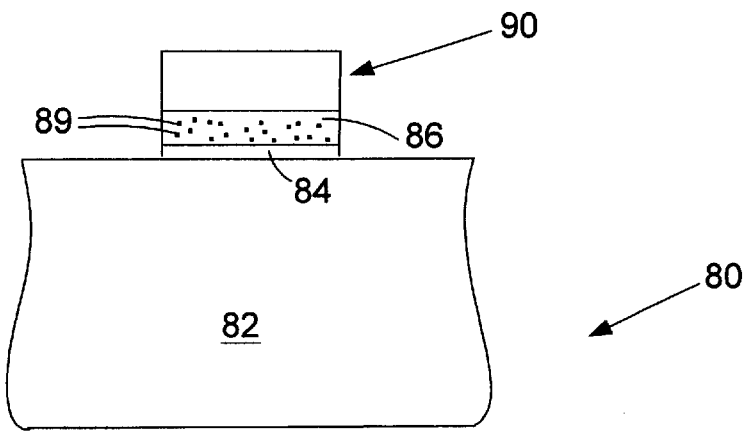
Figure 9:
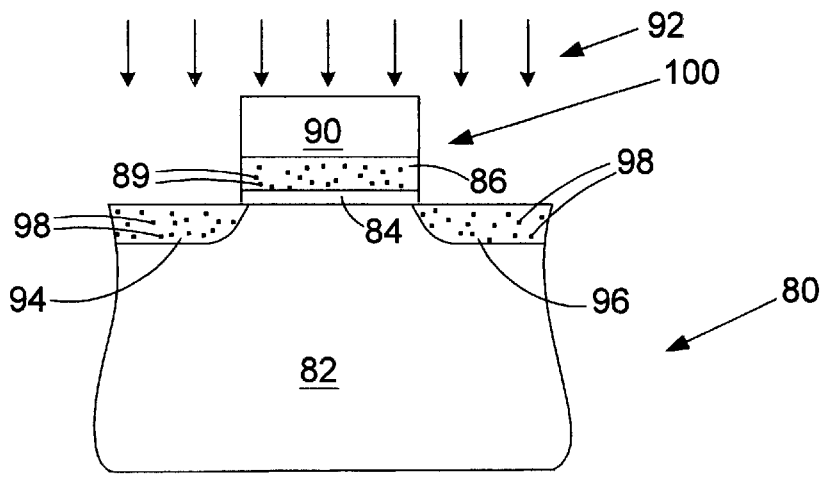

FIGS. 7–14 illustrate a second embodiment of the invention. FIG. 7 shows a device 80 including a silicon substrate 82, a dielectric in the form of an oxide layer 84 thereover, and a polysilicon layer 86 (substantially thinner than that in the process of FIG. 1–6) formed over the oxide layer 84. The polysilicon layer 86 is implanted (88) with a dopant specie 89 of a chosen type and concentration which can be different from that which will be implanted to form the source and drain regions of the device, or the polysilicon layer 86 may be left undoped. The choice and concentration of dopant specie (or alternatively the lack of such dopant specie) will be instrumental in determining a work function of the gate of the resulting structure as will be described further on.

A mask layer, for example a nitride layer 90, is formed over the polysilicon layer 86, and polysilicon body 86, cap body 90 and gate oxide 84 (FIG. 8) are formed therefrom by well-known means.

Figure 10:
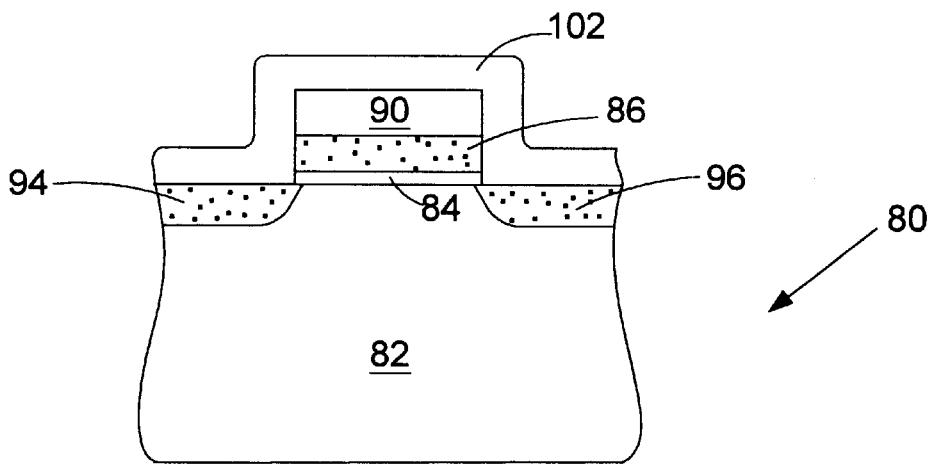
Figure 11:
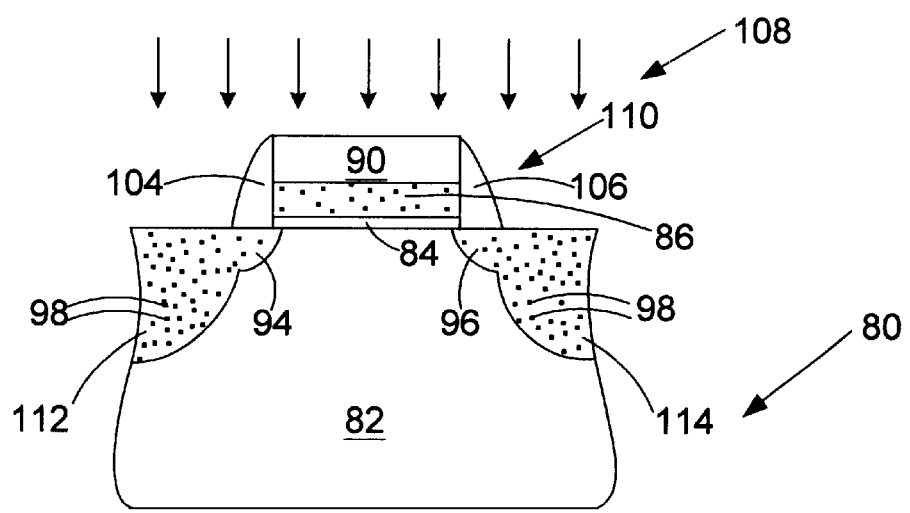

Then, an ion implantation step 92 is undertaken (FIG. 9) to form lightly doped regions 94, 96, selection of this dopant specie 98 being appropriate to the type of device to be fabricated, for example arsenic for an N type device, or boron for a P type device, using the cap body 90, polysilicon body 86 and gate oxide 84 as an overall mask 100. With reference to FIG. 10, an oxide layer 102 is deposited over the resulting structure, and is anisotropically etched to form spacers 104, 106 on the opposite sides of the polysilicon body 86 and cap body 84 (FIG. 11). Then, an ion implantation step 108 is undertaken using the spacers 104, 106, along with the cap body 90, polysilicon body 86 and oxide layer 84 as an overall mask 110 to form heavily doped regions 112, 114, again with selection of this dopant specie 98 being appropriate to the type of device to be fabricated, i.e., for example arsenic for an N type device, or boron for a P type device. (FIG. 11).

Figure 12:
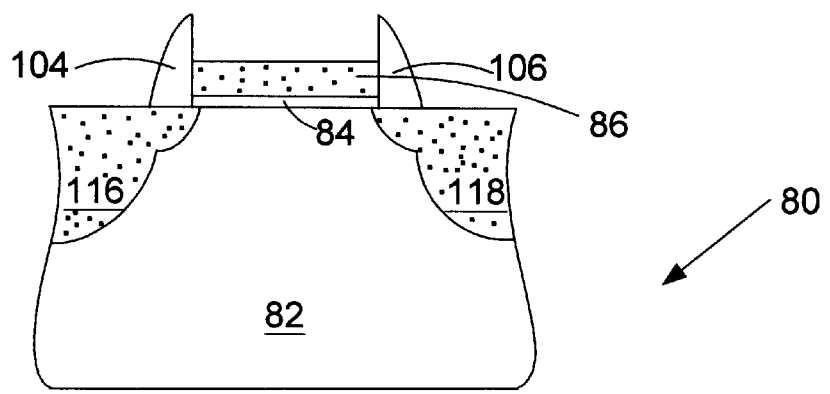

Annealing (such as rapid thermal anneal) is undertaken to activate the implants to form the source drain regions 116, 118 of the device 80. With reference to FIG. 12, the cap body 90 is removed by appropriate means such as etching (as noted, the cap body 90 and spacers 104, 106 may be of different materials so that the removal of the cap body 90 does not affect the spacers 104, 106).

Figure 13:
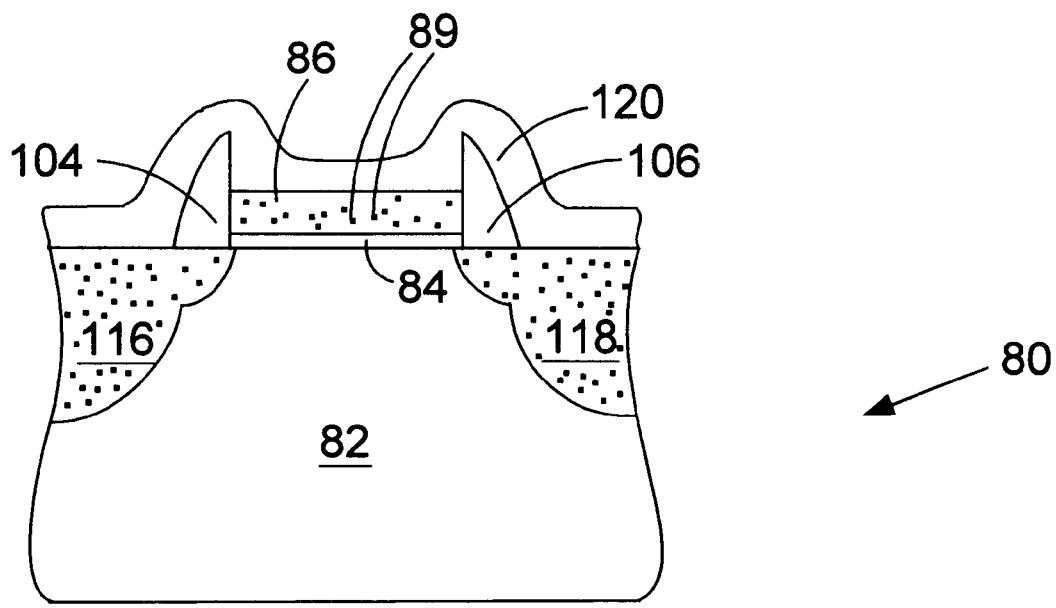

Next, with reference to FIG. 13, a metal layer 120, for example, nickel, is deposited over the resulting structure, i.e., over the polysilicon body the 6, the spacers 104, 106, and the substrate 82 over the source and drain regions 116, 118, the nickel layer 120 being more than one-half as thick as the polysilicon body 86.

Then, the resulting structure undergoes a rapid thermal anneal, causing the nickel 120 to react with the silicon of the substrate 82 and the polysilicon body 86 to grow nickel silicide 122, 124, 126 into the polysilicon body 86 (to form gate 122) and into the source and drain regions 116, 118. Again, the nickel layer 120 is thick enough in relation to the thickness of the polysilicon body 86, and the silicidation step is undertaken long enough, to provide that substantially the entire polysilicon body 86 is silicidized. However, because the polysilicon body 86 is substantially thinner than the polysilicon body 36 of the embodiment of FIG. 1–6, the resulting silicide gate 122 and the silicide regions 124, 126 in the source and drain regions 116, 118 are substantially thinner or shallower than in the embodiment of FIG. 1–6, i.e., the silicide regions 124, 126 do not extend into the source and drain regions as deeply as in that embodiment, avoiding possible problems of shorting of the source and/or drain regions. Thus, proper device configuration is achieved even with relatively shallow source and drain regions. Inclusion of the cap body 90 over the polysilicon body 86 during the ion implantation step 108 (FIG. 11) allows for provision of a thinner polysilicon body 86, while insuring that proper masking of the semiconductor body 82 under the overall mask 110 is achieved.

Similar to the previous process, the dopant 89 in the polysilicon body 86, previously generally evenly distributed therewithin, is driven downward by the downwardly advancing interface of nickel silicide and polysilicon until a substantial amount of the dopant specie 89 is pushed into a portion 150 of the gate 122 adjacent the gate oxide 84, so that the portion 150 of the gate 122 adjacent the gate oxide 84 contains a substantially higher dopant concentration than the portion 152 further away from the gate oxide 84. This results in a work function of the gate 122 being determined as described above. However, in this embodiment, instead of the work function of the gate 122 being determined by the dopant specie 98 used for the source 116 and drain 118 of the device 80, the work function of the gate 122 is determined by independent selection of the dopant specie 89 in the polysilicon body 86. It will thus be seen that the work function of the gate 122 can be selected and tailored to specific needs, independent of the dopant specie chosen for the source and drain of the device 80.

Figure 14:
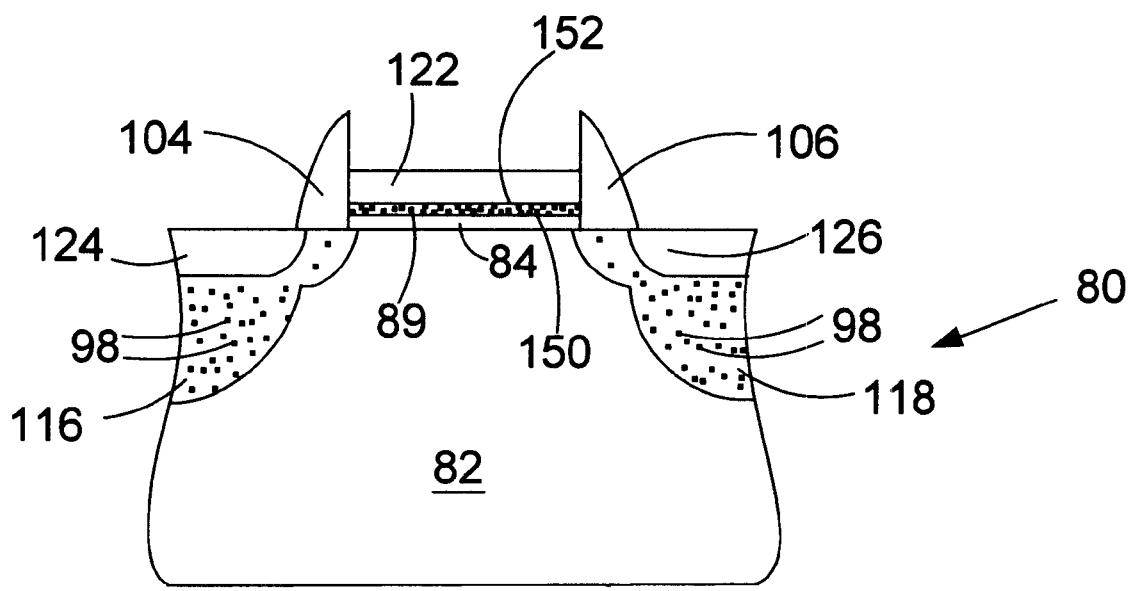

The unreacted nickel portions are then removed, leaving the structure shown in FIG. 14.

It will be understood that while specific N type and P type dopants are described above, any appropriate dopant specie, including N type, P type, or neither N type nor P type, can with advantage be utilized.

Initially, it will be seen that the advantages of a metal gate device are provided, i.e., increased conductivity as compared to a polysilicon gate device, and avoidance of problems of polysilicon depletion and for a penetration. Additionally, tailoring of the work function of the gate can be achieved, allowing reduction of dopant concentration in the device channel (with its attendant advantages) without compromising device performance.

The foregoing description of the embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of fabricating a semiconductor structure comprising:
   providing a substrate;
   providing a dielectric on the substrate;
   providing a polysilicon body on the dielectric;
   providing a metal layer on the polysilicon body;
   undertaking a silicidation process to silicidize substantially the entire polysilicon body.

2. The method of claim 1 and further comprising the step of providing that the metal layer on the polysilicon body is a nickel metal layer more than one-half as thick as the polysilicon body.

3. The method of claim 1 wherein the step of undertaking a silicidation process to silicidize substantially the entire polysilicon body comprises forming a gate on the dielectric.

4. A method of fabricating a semiconductor structure comprising:
   providing a substrate;
   providing a dielectric on the substrate;
   providing a polysilicon body on the dielectric, the polysilicon body containing a dopant specie;
   providing a metal layer on the polysilicon body; and
   undertaking a silicidation process to silicidize substantially the entire polysilicon body and provide a conductive body on the dielectric.

5. The method of claim 4 wherein the step of undertaking the silicidation process drives a substantial portion of the dopant specie to adjacent the dielectric.

6. The method of claim 4 and further comprising the step of selecting the dopant specie in the polysilicon body, the selection thereof being dependent upon the desired work function of the conductive body.

7. The method of claim 6 and further comprising the step of providing that the conductive body is a gate.

8. The method of claim 4 and further comprising the step of providing that the metal layer is a nickel metal layer more than one-half as thick as the polysilicon body.

9. The method of claim 6 and further comprising the step of providing that the dopant specie is N type dopant.

10. The method of claim 9 and further comprising the step of providing that the dopant specie is arsenic.

11. The method of claim 6 and further comprising the step of providing that the dopant specie is P type dopant.

12. The method of claim 11 and further comprising the step of providing that the dopant specie is boron.

13. The method of claim 6 and further comprising the step of providing that the dopant specie is neither N type nor P type.

14. A method of fabricating a semiconductor structure comprising:

providing a substrate;

providing a dielectric on the substrate;

providing a polysilicon body on the dielectric;

providing a cap body on the polysilicon body;

introducing dopant into the substrate using the cap body and polysilicon body as a mask;

removing the cap body from the polysilicon body;

providing a metal layer on the polysilicon body; and undertaking a silicidation process to silicidize substantially the entire polysilicon body.

15. The method of claim 14 and further comprising providing spacers on opposite sides of the cap body and polysilicon body, the spacers, along with the cap body and polysilicon body, acting as a mask for introducing dopant into the substrate.

16. The method of claim 14 and further comprising the step of providing that the metal layer on the polysilicon body is a nickel layer more than one-half as thick as the polysilicon body.

17. The method of claim 14 wherein the step of undertaking a silicidation process to silicidize substantially the entire polysilicon body comprises forming a gate on the dielectric.

18. The method of claim 14 wherein the step of providing a polysilicon body on the dielectric comprises providing a polysilicon body containing a dopant specie.

19. The method of claim 18 and further comprising the step of providing that the dopant specie in the polysilicon body is N type dopant.

20. The method of claim 19 and further comprising the step of providing that the dopant specie in the polysilicon body is arsenic.

21. The method of claim 18 and further comprising the step of providing that the dopant specie in the polysilicon body is P type dopant.

22. The method of claim 21 and further comprising the step of providing that the dopant specie in the polysilicon body is boron.

23. The method of claim 18 and further comprising the step of providing that the dopant specie in the polysilicon body is neither N type nor P type.

* * * * *